United States Patent
Naniwada (10) Patent No.: US 7,463,116 B2
(45) Date of Patent: Dec. 9, 2008

(54) MICRO-RESONATOR, FREQUENCY FILTER AND COMMUNICATION APPARATUS

(75) Inventor: Koji Naniwada, Tokyo (JP)

(73) Assignee: Sony Corporation, Tokyo (JP)

( * ) Notice: Subject to any disclaimer, the term of this patent is extended or adjusted under 35 U.S.C. 154(b) by 218 days.

(21) Appl. No.: 11/287,932

(22) Filed: Nov. 28, 2005

(65) Prior Publication Data

US 2006/0140646 A1 Jun. 29, 2006

(30) Foreign Application Priority Data

Dec. 1, 2004 (JP) ............................ P2004-349054

(51) Int. Cl.
*H03H 9/46* (2006.01)
*H03H 9/52* (2006.01)

(52) U.S. Cl. ...................... 333/186; 333/200

(58) Field of Classification Search .............. 333/186, 333/187, 189
See application file for complete search history.

(56) References Cited

U.S. PATENT DOCUMENTS

| | | | | |
|---|---|---|---|---|
| 5,698,928 | A * | 12/1997 | Mang et al. ................. | 310/322 |
| 6,486,751 | B1 * | 11/2002 | Barber et al. ............... | 333/187 |
| 6,624,726 | B2 * | 9/2003 | Niu et al. ................... | 333/197 |
| 6,828,877 | B2 * | 12/2004 | Nakanishi et al. ........... | 333/186 |
| 7,227,432 | B2 * | 6/2007 | Lutz et al. ................... | 333/186 |
| 7,286,027 | B2 * | 10/2007 | Tada et al. .................. | 333/186 |
| 2007/0171001 | A1 * | 7/2007 | Naniwada et al. ........... | 333/186 |

* cited by examiner

*Primary Examiner*—Barbara Summons
(74) *Attorney, Agent, or Firm*—Sonnenschein Nath & Rosenthal LLP (57) ABSTRACT

A highly reliable micro-resonator and communication apparatus is provided in which an influence on a substrate caused by an interaction generated by an oscillation between adjacent micro-resonant elements is eliminated.

The micro-resonant element includes a plurality of micro-resonant elements using a micro-mechanical oscillation provided on the same substrate, in which a micro-resonant element to oscillate in a first phase and a micro-resonant element to oscillate in a second phase that is a reverse phase to the first phase are disposed to be a pair.

13 Claims, 10 Drawing Sheets

MICRO-RESONATOR, FREQUENCY FILTER AND COMMUNICATION APPARATUS

CROSS REFERENCES TO RELATED APPLICATIONS

The present invention contains subject matter related to Japanese Patent Application JP 2004-394054 filed in the Japanese Patent Office on Dec. 1, 2004, the entire contents of which being incorporated herein by reference.

BACKGROUND OF THE INVENTION

1. Field of the Invention

The present invention relates to a micro-resonator, a frequency filter including the micro-resonator and a communication apparatus provided with a filter based on the micro-resonator.

2. Description of the Related Art

A demand for wireless network technology has been rising due to a reason that the number of devices that use a network increases remarkably in recent years with progress in information technology and in light of usability. In an RF (high frequency) front-end module used in wireless communication, there exist components of a comparatively large size such as a RF (high frequency) filter, a SAW (surface acoustic wave) filter and dielectric filter used as an IF (intermediate frequency) filter as well as a semiconductor chip, and the existence thereof has prevented miniaturization and cost reduction of the RF front-end. It is desired lately to incorporate those filtering functions into a semiconductor chip.

On the other hand, attention has been paid in recent years to a micro-machine (MEMS: Micro Electro Mechanical Systems) element and a small device in which a MEMS element is incorporated. A basic characteristic of the MEMS element is that a driving body constructed as a mechanical structure is incorporated into a part of the element, and the driving body is electrically driven by an application of coulomb force between electrodes and the like.

Since a micro-oscillation element formed by using a micro-machining technology based on a semiconductor process has such advantages that an area occupied by a device is small, a high Q-value can be obtained and an integration with another semiconductor device is possible, a use as an intermediate frequency (IF) filter and high frequency (RF) filter in wireless communication devices has been proposed by research laboratories including Michigan University (refer to Non-patent Reference 1).

Figure 1:
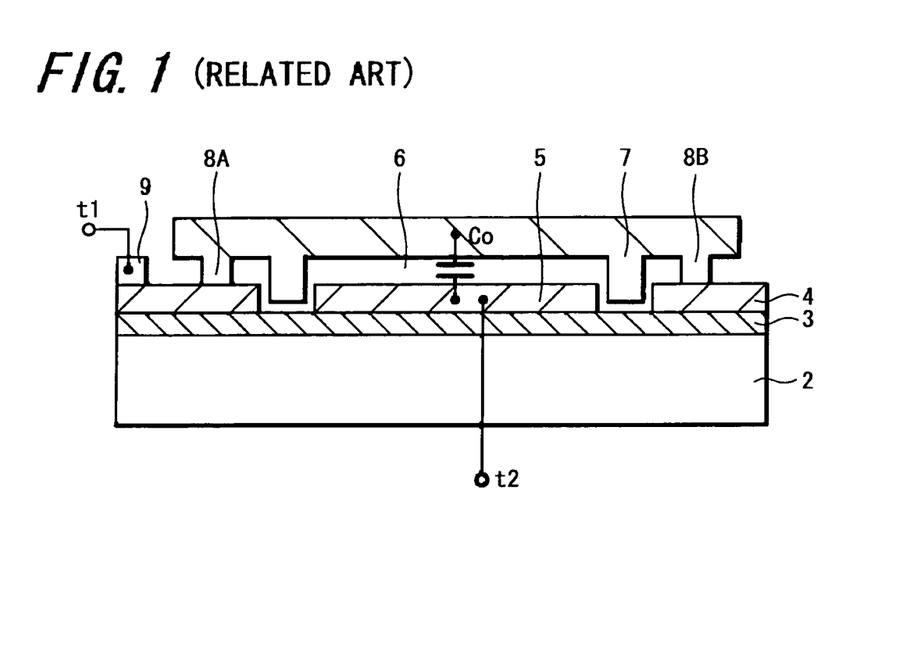
FIG. 1 is a cross-sectional diagram of a MEMS resonator in related art.

FIG. 1 is a schematic view of an oscillator, specifically a MEMS-type resonator, constituting a high frequency filter described in Non-patent reference 1. This resonator 1 includes an input-side wiring layer 4 and an output electrode 5 made of polycrystalline silicon, for example, formed on a semiconductor substrate 2 through an insulation film 3 and a beam made of, for example, polycrystalline silicon capable of oscillating, that is, what is called a beam-type oscillation electrode 7 is formed to face the output electrode 5 separated by a space 6. The oscillation electrode 7 is connected to the input-side wiring layer 4 by straddling the output electrode 5 like a bridge such that anchor portions (support portions) 8 [8A, 8B] on both ends support this electrode. The oscillation electrode 7 becomes an input electrode. An input terminal t1 is led out from a gold (Au) film 9 of the input-side wiring 4, and an output terminal t2 is led out from the output electrode 5.

In this resonator 1, a high frequency signal S1 is supplied to the oscillation electrode 7 through the input terminal t1 in a state where a DC bias voltage V1 is applied between the oscillation electrode 7 and the ground. Specifically, when the DC bias voltage V1 and high frequency signal S1 are input from the input terminal t1, the oscillation electrode 7 that has a natural oscillation frequency determined by a length L oscillates by electrostatic generated between the output electrode 5 and the oscillation electrode 7. By means of the oscillation, a high frequency signal corresponding to a temporal change of capacitance between the output electrode 5 and the oscillation electrode 7 and the DC bias voltage is output from the output electrode 5 (therefore, from the output terminal t2). In the high frequency filter, a signal corresponding to the natural oscillation frequency (resonant frequency) of the oscillation electrode 7 is output.

[Non-patent Reference 1] IEEE Journal of Solid-state Circuits, Vol. 35, No. 4, April 2000

SUMMARY OF THE INVENTION

Typically, there is such a tendency that a resonance peak as an output signal becomes small in a high frequency region, and it is necessary to improve an SN ratio of the resonance peak in order to obtain an excellent filter characteristic in the high frequency region. According to a disk-type oscillator related to the technical literature of Michigan University, a noise component of an output signal is caused by a signal which is directly transmitted through parasitic capacitance C0 formed between the oscillation electrode 7 of the input electrode and the output electrode 5.

Figure 2:
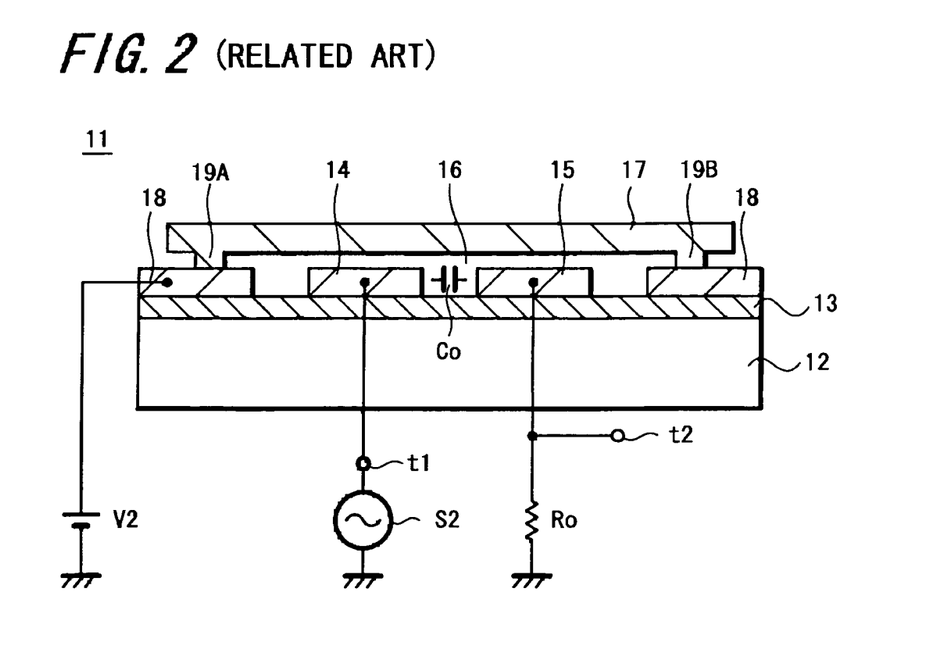
FIG. 2 is a cross-sectional diagram showing an example of a micro-resonator according to related art.

As a method of reducing the noise component, a structure is conceivable in which an oscillation electrode to apply a DC bias voltage is disposed between an input electrode and an output electrode. FIG. 2 shows related art in which the above-described method of reducing the noise component is applied to a resonator of a beam-type structure. This resonator 11 includes an input electrode 14 and an output electrode 15 formed on a semiconductor substrate 12 through an insulation film 13, for example, and what is called a beam-type oscillation electrode 17 that is an electrode to be an oscillation plate formed to face those input electrode 14 and output electrode 15 separated by a space 16. The oscillation electrode 17 straddles the input and output electrodes 14 and 15 like a bridge, and both ends are integrally supported by support portions (what is called anchor portions) 19 [19A, 19B] such that this electrode is connected to a wiring layer 18 disposed outside the input and output electrodes 14 and 15. The input electrode 14, output electrode 14, and wiring layer 18 are formed by using the same conductive material, and are formed by using a polycrystalline silicon film, a metal film such as an aluminum film, and the like, for example.

An input terminal t1 is provided with the input electrode 14, and a high frequency signal S2 is input through the input terminal t1. An output terminal t2 is provided with the output electrode 15, and a high frequency signal of an objective frequency is output from the output terminal t2. A required DC bias voltage V2 is applied to the oscillation electrode 17.

In this MEMS resonator 11, when the high frequency signal S2 is input into the input electrode 14, the oscillation electrode 17 resonates by electrostatic power generated between the oscillation electrode 17 to which the DC bias voltage V2 is applied and the input electrode 14, and the high frequency signal of the objective frequency is output from the output electrode 15. According to this MEMS resonator element 11, since areas faced by the input and output electrodes 14 and 15 can be small and a space between the input and output electrodes 14 and 15 can be large, the parasite capacitance C0 between the input and output electrodes becomes small. Accordingly, a signal directly transmitted through the parasite capacitance C0 between the input and output electrodes 14 and 15, specifically a noise component, becomes small and an SN ratio of the output signal can be improved.

However, in the MEMS resonator 11 having the beam structure as shown in the above-described FIG. 2, there is such a problem that it is difficult to be applied to a high frequency (RF) device of basically 50Ω as impedance of a system due to a reason that the impedance becomes high, specifically, the impedance in a resonator of several μm to several tens μm reaches several tens KΩ to several hundreds KΩ.

Figure 3:
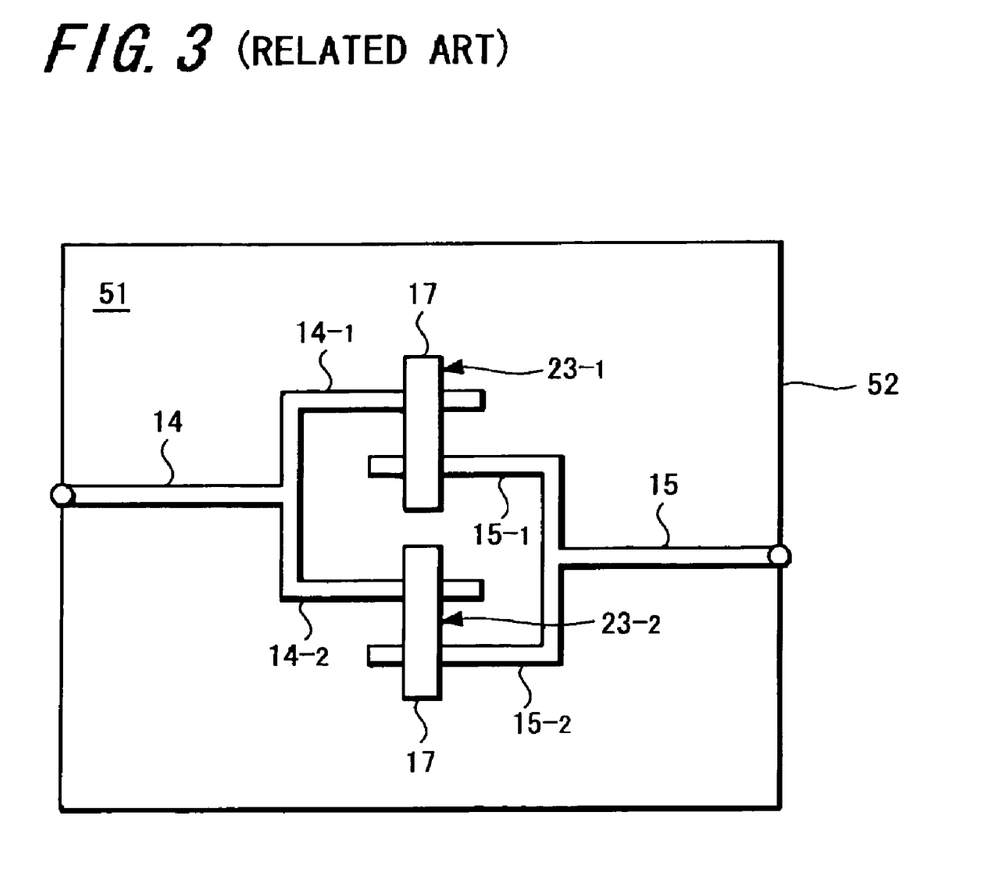
FIG. 3 is a constitutional diagram showing an example of a micro-resonator according to related art.
Figure 4A:
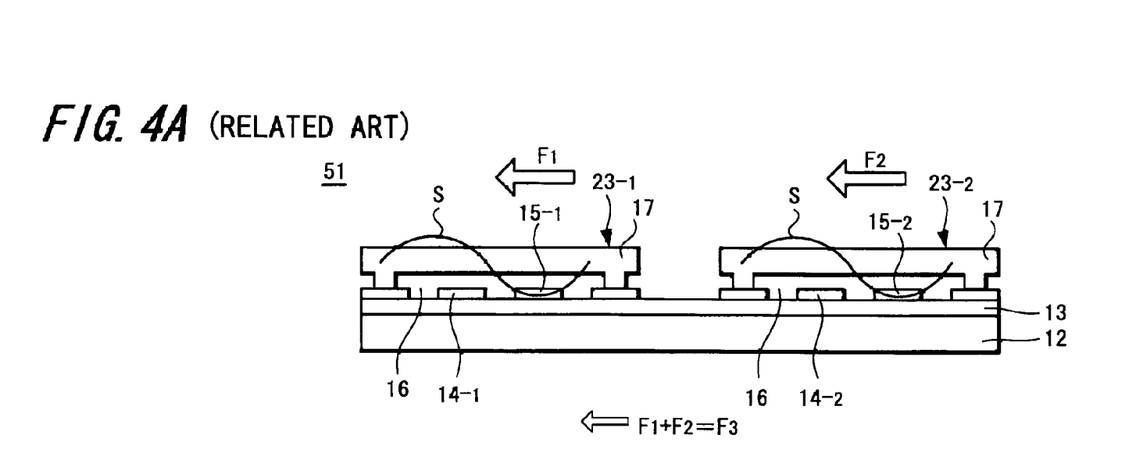
FIG. 4A is a cross-sectional diagram of the micro-resonant element in the relevant part of FIG. 3.
Figure 4B:
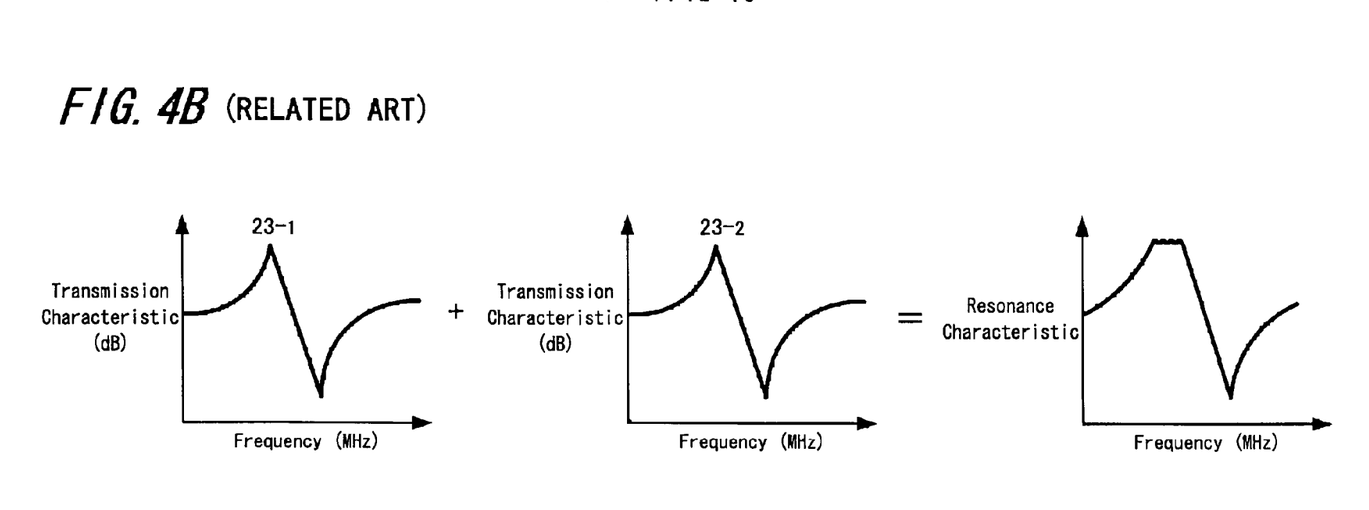
FIG. 4B is a diagram showing an example in which transmission characteristics of adjacent micro-resonant elements of FIG. 3 are overlapped.

Then, a structure is conceivable as a method of reducing the impedance, in which a plurality of MEMS resonator elements having the beam structure are connected electrically in parallel. FIGS. 3, 4A and 4B show related art in which the above-described method of reducing the impedance is applied to a resonator of the beam-type structure (Japanese Patent Application No. 2003-377302).

A resonator 51 includes a plurality of, in this example, two MEMS resonator elements 23 [23-1, 23-2] having a beam structure disposed in parallel on a common substrate 52 and the plurality of MEMS resonator elements 23 [23-1, 23-2] are connected electrically in parallel.

Specifically, each of the MEMS resonator elements 23-1 and 23-2 is made such that an input electrode 14 and an output electrode 15 on the same plane of the substrate 52 are each divided in two to be respectively formed, and a beam to be an independent oscillation plate, that is, an oscillation electrode 17 of what is called a beam-type is each formed to face divided pairs of input and output electrodes 14-1 and 15-1, and input and output electrodes 14-2 and 15-2 separated by a space 16 respectively. The MEMS resonator elements 23-1 and 23-2 are disposed in parallel on the same substrate 52 and the input electrodes 14-1 and 14-2 are connected in common and the output electrodes 15-1 and 15-2 are connected in common to be a structure of connected in parallel.

However, when micro-resonators such as the MEMS resonator element are disposed close to each other as shown in FIG. 4A, an oscillating phase S generated by oscillation of the oscillation electrodes 17 of adjacent micro-resonant elements coincide with each other, a force F1 generated in the micro-resonant element 23-1 and a force F2 generated in the micro-resonant element 23-2 by this oscillation are overlapped by mutually interacting, and a vector F3 that is combined force of F1 and F2 is generated on the substrate 12. As a result, the substrate 12 bends by the combined force F3, and there arises such a problem that an unnecessary oscillation mode is induced on the substrate 12 due to the oscillation of the oscillation electrode 17. As shown in FIG. 4B, when a transmission characteristic of the micro-resonant element 23-1 and a transmission characteristic of the micro-resonant element 23-2 are overlapped in a state where the unnecessary oscillation is induced on the substrate 12, peaks of the resonance characteristics of both the micro-resonant elements are not the same due to the above-described oscillation of the substrate 12. Specifically, there arises such a problem that the transmission characteristic after being overlapped becomes unstable and a desirable transmission characteristic may not be obtained. Particularly, in case of a micro-resonator using a beam having a structure in which both ends thereof are supported, there is such a problem that an oscillation is easily conveyed to the substrate through a support portion that supports the beam.

Further, when a plurality of micro-resonant elements are disposed in parallel, force generated by oscillation of a beam of each micro-resonant element is added up on the substrate.

As a result, there arises such a problem that the substrate bends due to a larger force generated on the substrate, causing unnecessary oscillation to be further increased.

Here, although it is also conceivable to dispose adjacent micro-resonant elements at sufficiently wide intervals in order to reduce the influence of the interaction, an area occupied by the wiring and micro-resonant element on the substrate becomes large in that case, which decreases the performance of the micro-resonator and also prevents the micro-resonator from being small-sized.

Further, when a frequency filter is formed by using the above-described micro-resonator, there is such a problem that the reliability of the frequency filter decreases due to unfavorable transmission characteristic of the micro-resonator. In addition, when the filter including the above-described micro-resonator is used for a communication apparatus, there is such a problem that the reliability of the communication apparatus decreases due to unfavorable transmission characteristic of the filter.

In view of the problems described above, the present invention is to provide a micro-resonator in which a stable and excellent transmission characteristic is obtained by suppressing an unnecessary oscillation on the substrate side.

In addition, the present invention is to provide a highly reliable frequency filter including the micro-resonator, and furthermore to provide a highly reliable communication apparatus having the filter including the micro-resonator.

A micro-resonator according to an embodiment of the present invention includes a plurality of micro-resonant elements using a micro-mechanical oscillation provided on the same substrate, in which a micro-resonant element to oscillate in a first phase and a micro-resonant element to oscillate in a second phase that is a reverse phase to the first phase are disposed to be a pair.

It is preferable that the plurality of micro-resonant elements are connected electrically in parallel.

A micro-resonator according to an embodiment of the present invention includes a plurality of micro-resonant elements which are provided with an input electrode and output electrode disposed on the same plane and a beam that becomes an oscillation plate disposed to face the input electrode and output electrode separated by a space and which are connected electrically in parallel and are disposed in parallel on the same substrate, in which either the input electrodes or output electrodes are disposed to face each other.

It is preferable that the micro-resonator includes a plurality of beams made of oscillation plates disposed in parallel with the input electrode and the output electrode in common.

It is preferable that the micro-resonator has a support member to support the beam and the support member is arranged on the substrate.

A frequency filter according to an embodiment of the present invention includes a micro-resonator which has a plurality of micro-resonant elements using a micro-mechanical oscillation on the same substrate and in which a micro-resonant element to oscillate in a first phase and a micro-resonant element to oscillate in a second phase that is a reverse phase to the first phase are disposed to be a pair.

It is preferable that the plurality of micro-resonant elements are connected electrically in parallel.

A frequency filter according to an embodiment of the present invention includes a micro-resonator which has a plurality of micro-resonant elements provided with an input electrode and output electrode disposed on the same plane and a beam that becomes an oscillation plate disposed to face the input electrode and output electrode separated by a space, and which are connected electrically in parallel and are disposed in parallel on the same substrate, in which either the input electrodes or output electrodes are disposed to face each other.

It is preferable that the frequency filter includes a plurality of beams made of oscillation plates disposed in parallel with the input electrode and the output electrode in common.

A communication apparatus according to an embodiment of the present invention is the communication apparatus having a filter to limit a band of a transmission signal and/or reception signal, and includes as the filter a filter having a micro-resonator in which a plurality of micro-resonant elements using a micro-mechanical oscillation are provided on the same substrate, and in which a micro-resonant element to oscillate in a first phase and a micro-resonant element to oscillate in a second phase that is a reverse phase to the first phase are disposed to be a pair.

It is preferable that the plurality of micro-resonant elements are connected electrically in parallel.

A communication apparatus according to an embodiment of the present invention has a filter to limit a band of a transmission signal and/or reception signal, and the filter includes a micro-resonator having a plurality of micro-resonant elements which are provided with an input electrode and output electrode disposed on the same plane and a beam that becomes an oscillation plate disposed to face the input electrode and output electrode separated by a space and which are connected electrically in parallel and are disposed in parallel on the same substrate, in which either the input electrodes or output electrodes are disposed to face each other.

It is preferable that the communication apparatus includes a plurality of beams made of oscillation plates disposed in parallel with the input electrode and the output electrode in common.

In the micro-resonator according to the embodiment of the present invention, an influence of an interaction of an oscillation can be reduced on the substrate by making adjacent micro-resonant elements have oscillation phases reverse to each other, and so a bend generated in the substrate due to the oscillation, specifically, an unnecessary oscillation can be prevented. Further, the frequency filter according to the embodiment of the present invention includes a micro-resonator whose transmission characteristic is excellent, and so a stable filter operation can be performed. Furthermore, the communication apparatus according to the embodiment of the present invention uses a filter based on the micro-resonator whose transmission characteristic is excellent, and so highly reliable communication can be performed.

According to the embodiment of the micro-resonator of the present invention, since the micro-resonant element to oscillate in the first phase and the micro-resonant element to oscillate in the second phase of the reversed phase thereto are disposed to be a pair, an unnecessary oscillation is not induced on the substrate at the time when operating the micro-resonator, because kinetic energy transmitted to the substrate from each micro-resonant element is cancelled with each other to provide a micro-resonator whose transmission characteristic is excellent. Further, in the micro-resonator in which a plurality of micro-resonant elements are connected electrically in parallel, the kinetic energy transmitted from each micro-resonant element to the substrate is comprehensively cancelled with each other, and so a micro-resonator, what is called a micro-resonator group, which has a stable and excellent transmission characteristic can be obtained.

According to the embodiment of the micro-resonator of the present invention, since either the input electrodes or output electrodes connected to the micro-resonant elements are disposed to face each other, the micro-resonator that has the excellent transmission characteristic can be provided by preventing the unnecessary oscillation generated in the substrate due to the oscillation of each micro-resonant element.

Further, when the micro-resonator includes the beams made of a plurality of oscillation plates disposed in parallel with the input electrode and the output electrode in common, a large number of micro-resonant elements can be included and a small-sized micro-resonator can be provided. In addition, when the beam is supported by the support member arranged on the substrate, the micro-resonator having an excellent transmission characteristic can be provided.

According to the embodiment of the frequency filter of the present invention, since the above-described micro-resonator of the embodiment of the present invention is used, the frequency filter whose filter characteristic is stable and highly reliable can be provided.

According to the embodiment of the communication apparatus of the present invention, since the filter of high transmission characteristic based on the above-described embodiment of the micro-resonator of the present invention, the communication apparatus whose communication reliability can be provided.

DESCRIPTION OF THE PREFERRED EMBODIMENTS

Hereinafter, a first embodiment of the present invention is explained by referring to the accompanied drawings. A micro-resonator used in the present invention is a resonator including a resonator element of a micro-scale and nano-scale.

Figure 5:
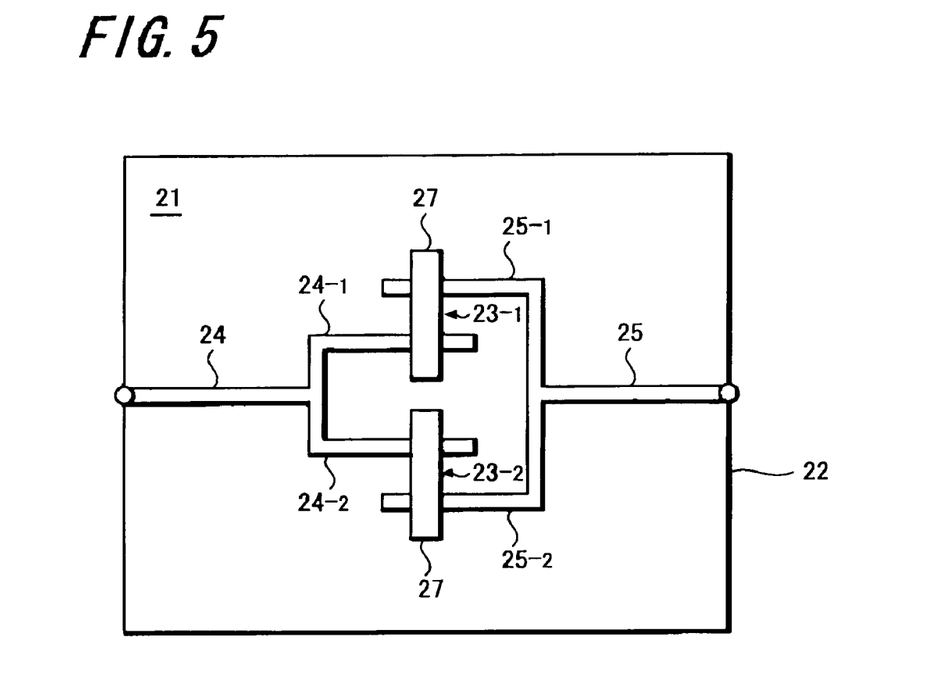
FIG. 5 is a constitutional diagram showing a first embodiment of a micro-resonator according to the present invention.

FIG. 5 shows a first embodiment of a micro-resonator according to the present invention. A micro-resonator 21 according to this embodiment includes a plurality of, in this example, two micro-resonant elements 23 [23-1, 23-2] having a beam structure disposed in parallel on a common substrate 22, in which the plurality of micro-resonant elements 23 [23-1, 23-2] are connected electrically in parallel.

Figure 6:
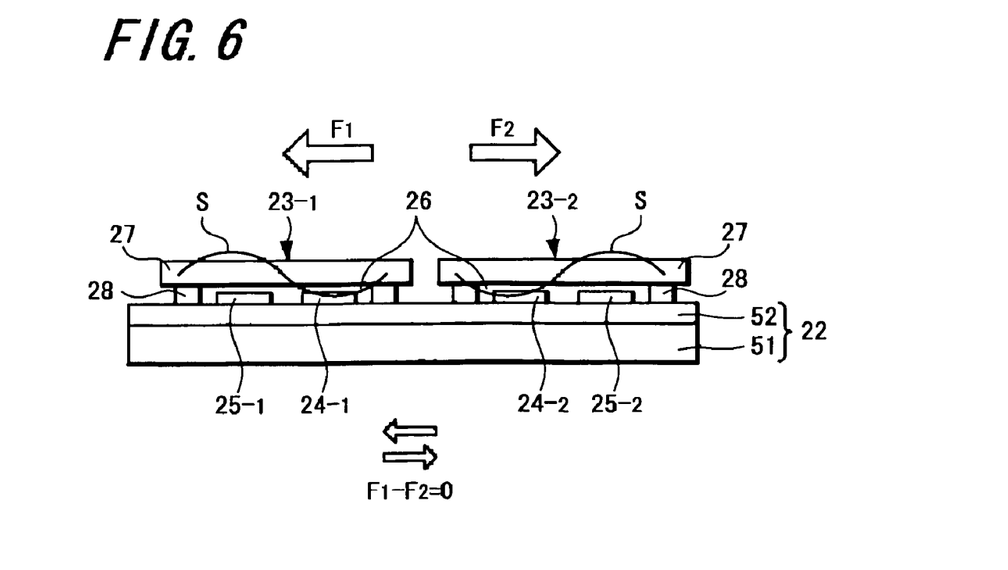
FIG. 6 is a cross-sectional diagram of the micro-resonator in the relevant part of FIG. 5.

Specifically, as shown in FIGS. 5 and 6, each of the micro-resonant elements 23-1 and 23-2 is formed by dividing an input electrode 24 and an output electrode 25 respectively in two on the same plane of the substrate 22 and beams which become independent oscillation plates what is called a beam-type oscillation electrodes 27 are formed to face divided pairs of the input and output electrodes 24-1 and 25-1, and the input and output electrodes 24-2 and 25-2 separated by a space 26, respectively. Since the input electrodes 24-1 and 24-2 are connected in common and the output electrodes 25-1 and 25-2 are connected in common, the micro-resonant elements 23-1 and 23-2 disposed in parallel on the same substrate 22 are connected in parallel. This micro-resonator 21 is formed as a micro-resonator group made of a plurality of what is called micro-resonant elements 23.

As shown in FIG. 5, the input electrode 24-1 connected to the micro-resonant element 23-1 and the input electrode 24-2 connected to the micro-resonant element 23-2 are disposed to face each other across a space that exists between both the micro-resonant elements. The output electrode 25-1 connected to the micro-resonant element 23-1 and the output electrode 25-2 connected to the micro-resonant element 23-2 are disposed outside such that the above-described input electrodes 24-1 and 24-2 are positioned in between. It should be noted that the input electrodes and output electrodes may be disposed in an opposite relation.

Specifically, the output electrode 25-1 connected to the micro-resonant element 23-1 and the output electrode 25-2 connected to the micro-resonant element 23-2 may be disposed to face each other across the space that exists between both the micro-resonant elements. In other words, either input electrodes or output electrodes are disposed facing each other to be close between the adjacent micro-resonant elements 23.

According to this embodiment, each input electrode 24 of the plurality of micro-resonant elements 23-1 and 23-2 is connected in common and each output electrode 25 thereof is connected in common to constitute the micro-resonator 21 as one device.

Each oscillation electrode 27 straddles the input and output electrodes 24 and 25 like a bridge, and both ends are supported to be connected to a wiring layer 28 that also functions as a support portion disposed outside the input and output electrodes 24 and 25.

For example, the substrate 22 is made of a substrate in which an insulation film is formed on a semiconductor substrate such as silicon (Si) and gallium arsenide (GaAs), an insulating substrate such as a quartz substrate and glass substrate and the like. In this example, a substrate in which a silicon nitride film is formed on a silicon substrate is used. The input electrode 24, output electrode 25 and wiring layer 28 can be formed with the same conductive material, and can be formed with a polycrystalline silicon film, a metal film such as aluminum (Al), further an impurity semiconductor layer formed by introducing impurities into a semiconductor substrate and the like, for example. The oscillation electrode 27 can be formed with a polycrystalline silicon film or a metal film such as aluminum (Al), for example.

A required frequency signal, which is a high frequency signal for example, is input into the input electrode 24 connected in common, and a signal of an objective frequency, which is a high frequency signal for example, is output from the output electrode 25 connected in common. A required DC bias voltage is applied to each oscillation electrode 27.

An operation of this micro-resonator 21 is as follows. The required DC bias voltage is applied to each oscillation electrode 27. When a high frequency signal, for example, is input into the input electrode 24, the oscillation electrode 27 resonates in a second-order oscillation mode by electrostatic power generated between the oscillation electrode 27 and the input electrode 24. A high frequency signal of the objective frequency is output from the output electrode 25 by the resonance of this oscillation electrode 27. When a signal of another frequency is input, the oscillation electrode 27 does not resonate, and a signal is not output from the output electrode 25.

According to the micro-resonator 21 of this embodiment, combined impedance of the micro-resonator 21 can be reduced by disposing a plurality of micro-resonant elements 23 [23-1, 23-2] in parallel, connecting an input electrode 24 and an output electrode 25 respectively in common, and connecting the micro-resonant elements 23-1 and 23-2 in parallel. Specifically, combined impedance $Za$ at this time becomes as follows.

$1/Za=(1/Z1)+(1/Z2)$ when $Z1=Z2$, $Za=(\frac{1}{2})Z1$

In other words, when each of the micro-resonant elements 23-1 and 23-2 is formed of the same pattern, and when values of the respective impedances $Z1$ and $Z2$ are the same value, the combined impedance $Za$ becomes one half the impedance $Z1$. Therefore, if two micro-resonant elements or more are disposed and connected in parallel, the micro-resonator 21 having the combined impedance suitable for an applicable electronic device can be obtained.

According to the micro-resonator 21 of this embodiment, as shown in FIGS. 5 and 6, an oscillation phase S of the micro-resonant element 23-1 becomes a reverse phase to an oscillation phase S of the micro-resonant element 23-2, which are adjacent to each other as shown in FIG. 6, by disposing either input electrodes 24 or output electrodes 25 connected to the adjacent micro-resonant elements 23 to face each other. As a result, when a force F1 generated in the micro-resonant element 23-1 and a force F2 generated in the micro-resonant element 23-2 by the oscillation of the oscillation electrode 27 mutually act on the substrate 22, the respective forces of F1 and F2 mutually act on opposite directions to cancel each other, so that the force generated on the substrate 22 becomes zero.

Figure 7:
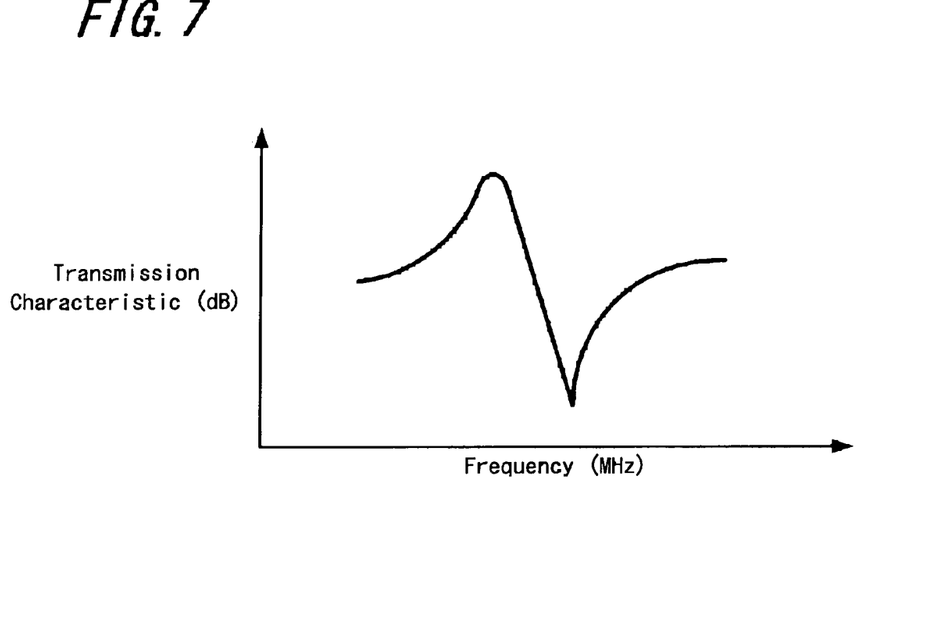
FIG. 7 is a diagram showing a resonance characteristic of a micro-resonator according to an embodiment of the present invention.

Therefore, since the force generated by the oscillation becomes zero, there is no possibility that the substrate 22 bends nor case that an unnecessary oscillation is induced. Specifically, the substrate 22 can be prevented from bending even when the force generated in the micro-resonant element by the oscillation acts on the substrate 22 through the support portion 28. Accordingly, as shown in FIG. 7, when the transmission characteristics of the adjacent micro-resonant elements 23-1 and 23-2 are overlapped in this state, an excellent transmission characteristic can be obtained.

Figure 8:
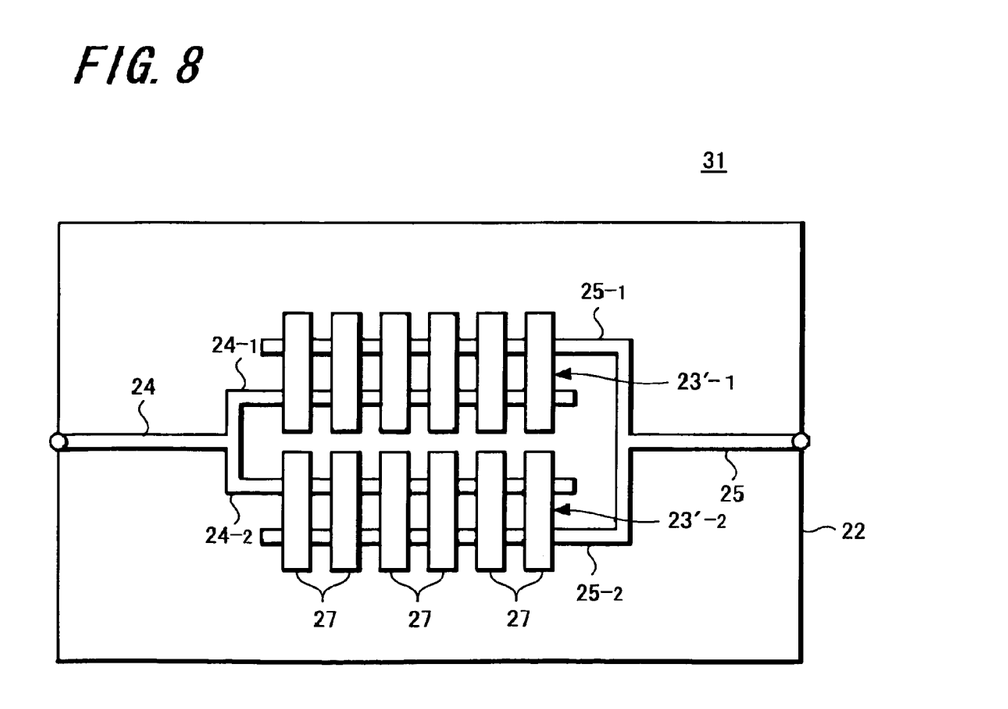
FIG. 8 is a constitutional diagram showing a second embodiment of a micro-resonator according to the present invention.

FIG. 8 shows a second embodiment of a micro-resonator according to the present invention.

A micro-resonator 31 according to this embodiment includes a plurality of oscillation electrodes 27 disposed in parallel on the input electrode 24 and output electrode 25 of the micro-resonator 21 shown in FIG. 5. Specifically, the plurality of the oscillation electrodes 27 are disposed in parallel along a longitudinal direction of each of the input and output electrodes 24 and 25.

On the input electrode 24-1 and output electrode 25-1 is formed a micro-resonant element row 23'-1, and on the input electrode 24-2 and output electrode 25-2 is formed a micro-resonant element row 23'-2, respectively.

The same reference numerals are given to portions corresponding to those in the first embodiment, and a duplicated explanation is omitted.

According to the micro-resonator 31 of this embodiment, one micro-resonator whose oscillation electrode area is enlarged can be obtained by adding the oscillation electrode 27 of each micro-resonant element 23. In addition, since either the input electrodes 24 or output electrodes 25, which are connected to the adjacent micro-resonant elements 23 are disposed to face each other, an oscillation phase of the micro-resonant element row 23'-1 can be reversed to an oscillation phase of the micro-resonant element row 23'-2 that is adjacent thereto, even when a plurality of oscillation electrodes 27 are arranged in parallel on one pair of input electrode 24 and output electrode 25. As a result, when forces generated in the micro-resonant element rows 23'-1 and 23'-2 by the oscillation of each oscillation electrode 27 act mutually on the substrate 22, the forces act on opposite directions to cancel each other, so that a sum of the forces generated on the substrate 22 becomes zero. Specifically, since there is possibility that the substrate 22 oscillates by the force generated in the micro-resonant element due to the oscillation, an excellent transmission characteristic can be obtained even when the transmission characteristics of the adjacent micro-resonant element rows are overlapped in this state.

Figure 9:
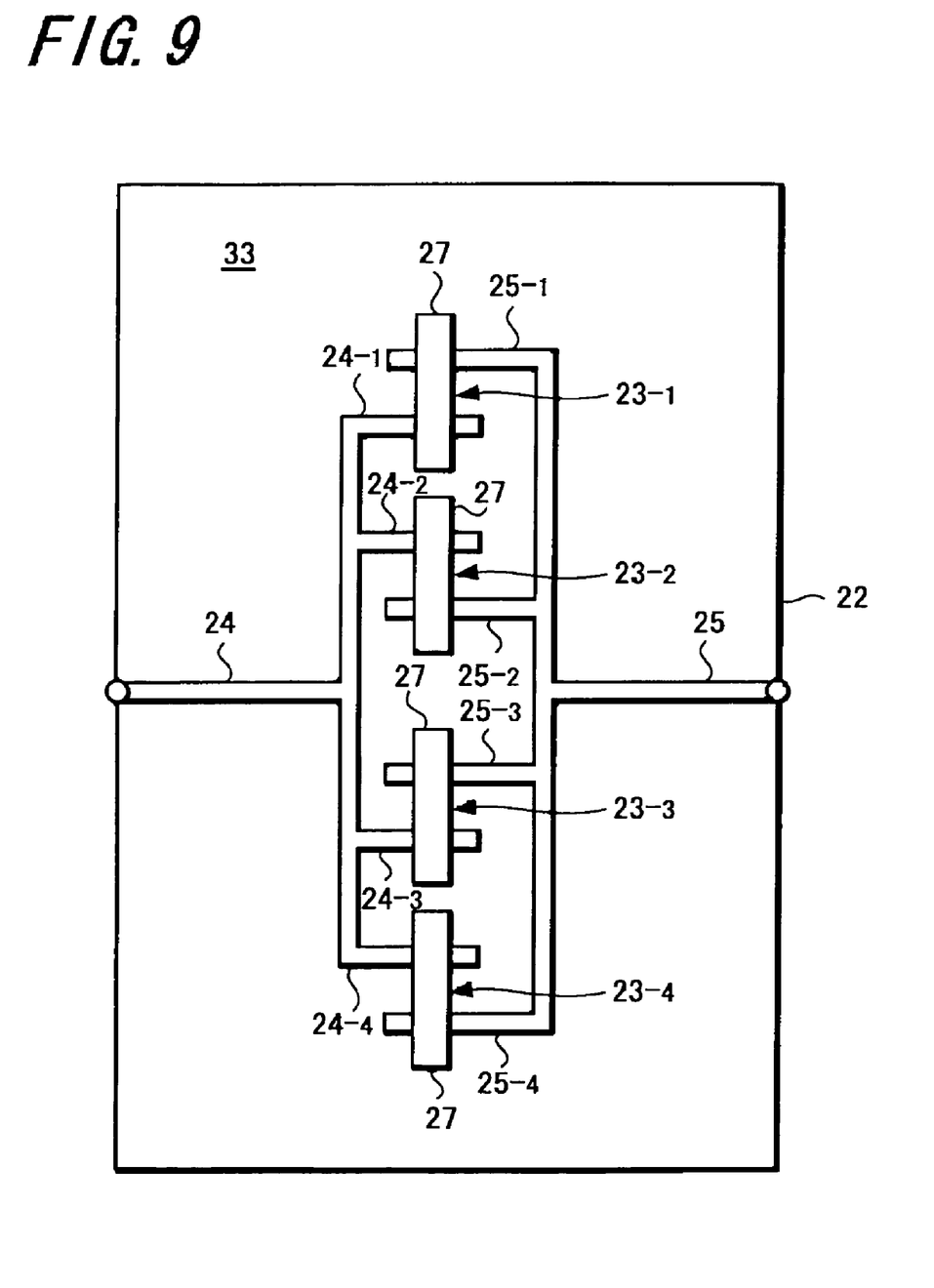
FIG. 9 is a constitutional diagram showing a third embodiment of a micro-resonator according to the present invention.

FIG. 9 shows a third embodiment of a micro-resonator according to the present invention. A micro-resonator 33 according to this embodiment includes a plurality of, in this example, four micro-resonant elements 23 [23-1, 23-2, 23-3, 23-4] having a beam structure are disposed in parallel on the common substrate 22, and those plurality of micro-resonant elements 23 [23-1, 23-2, 23-3, 23-4] are connected electrically in parallel. Specifically, each of the micro-resonant elements 23-1, 23-2, 23-3, and 23-4 is formed such that an input electrode 24 and an output electrode 25 are divided into four to be formed on the same plane of the substrate 22 respectively and what is called beam-type oscillation electrodes 27 that are beams to be each independent oscillation plate are formed to face respective divided pairs of input and output electrodes 24-1 and 25-1, input and output electrodes 24-2 and 25-2, input and output electrodes 24-3 and 25-3, and input and output electrodes 24-4 and 25-4 separated by a space, respectively. Since the input electrodes 24-1 through 24-4 are connected in common and the output electrodes 25-1 through 25-4 are connected in common, each of micro-resonant elements 23-1 through 23-4 is disposed in parallel on the same substrate 22 and is connected in parallel.

As shown in FIG. 9, in a relation between the adjacent micro-resonant elements 23-1 and 23-2, the input electrode 24-1 connected to the micro-resonant element 23-1 and the input electrode 24-2 connected to the micro-resonant element 23-2 are disposed to face each other across a space that exists between the both micro-resonant elements. The output electrode 25-1 connected to the micro-resonant element 23-1 and the output electrode 25-2 connected to the micro-resonant element 23-2 are disposed outside such that the above-described input electrodes 24-1 and 24-2 are positioned in between.

Further, in a relation between the adjacent micro-resonant element 23-2 and micro-resonant element 23-3, the output electrode 25-2 connected to the micro-resonant element 23-2 and the output electrode 25-3 connected to the micro-resonant element 23-3 are disposed to face each other across a space that exists between the both micro-resonant elements. The input electrode 24-2 connected to the micro-resonant element 23-2 and the input electrode 24-3 connected to the micro-resonant element 23-3 are disposed such that the above-described output electrodes 25-2 and 25-3 are positioned in between.

Furthermore, in a relation between the micro-resonant element 23-3 and the micro-resonant element 23-4, the input electrode 24-3 connected to the micro-resonant element 23-3 and the input electrode 24-4 connected to the micro-resonant element 23-4 are disposed to face each other across a space that exists between the both micro-resonant elements. The output electrode 25-3 connected to the micro-resonant element 23-3 and the output electrode 25-4 connected to the micro-resonant element 23-4 are disposed outside such that the above-described input electrodes 24-3 and 24-4 are positioned in between.

Specifically, between any adjacent micro-resonant elements 23, either the input electrodes 24 or output electrodes 25 are disposed to face each other across the space that exists between the micro-resonant elements.

According to this embodiment, each input electrode 24 of this plurality of micro-resonant elements 23-1 through 23-4 is connected in common and each output electrode 25 thereof is connected in common to constitute the micro-resonator 33 as one device.

According to the micro-resonator 33 of this embodiment, in the micro-resonator including a plurality of micro-resonant elements disposed in parallel, since either input electrodes 24 or output electrodes 25 which are connected to adjacent micro-resonant elements 23 are disposed to face each other, an oscillation phase of one micro-resonant element and an oscillation phase of a micro-resonant element that is adjacent thereto are reversed to each other.

As a result, when a force generated in each micro-resonant element by an oscillation of the oscillation electrode acts mutually on the substrate 22, the forces act mutually on the opposite directions to cancel each other to make the force generated on the substrate 22 becomes zero. Specifically, since the force acts on the substrate 22 becomes zero and there is no possibility that the substrate 22 oscillates by the force generated in the micro-resonant element due to the oscillation, an excellent transmission characteristic can be obtained when the transmission characteristics of the mutually adjacent micro-resonant elements are overlapped in this state.

Figure 10:
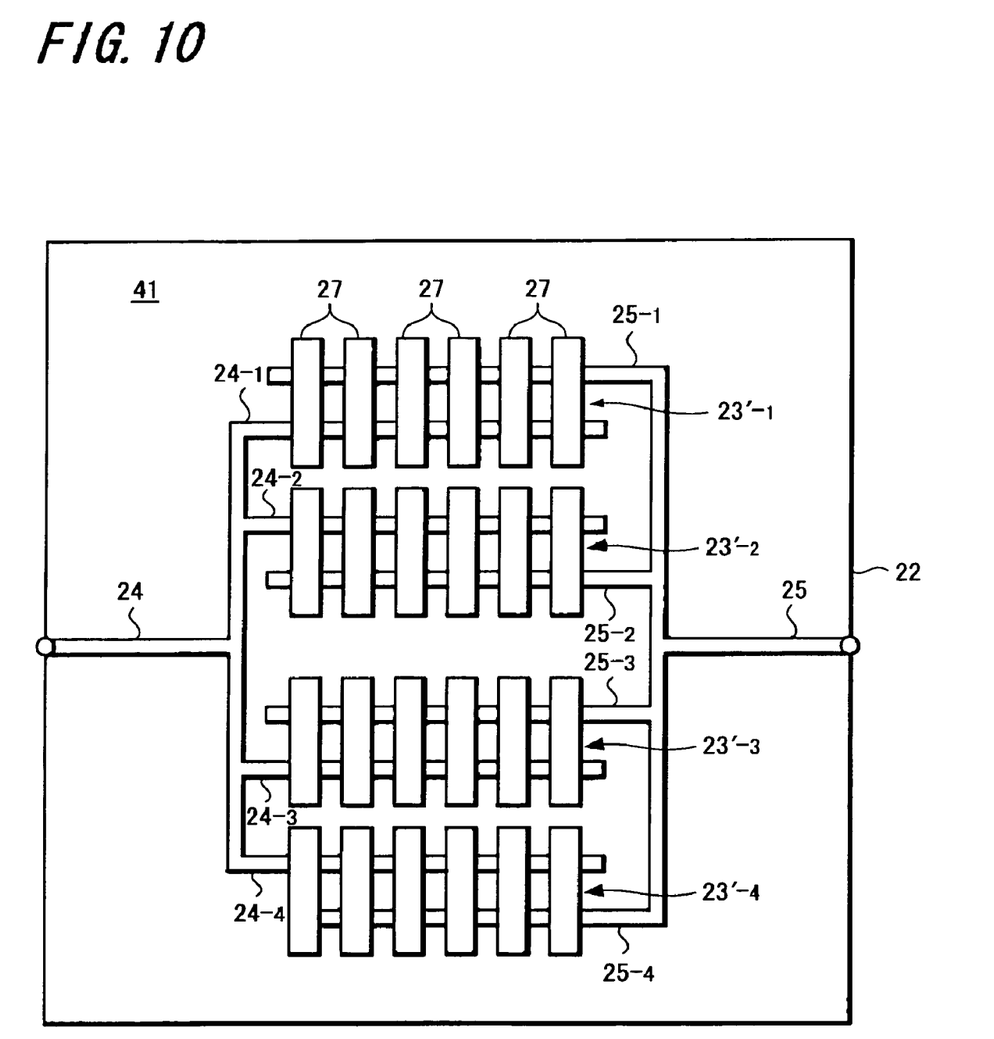
FIG. 10 is a constitutional diagram showing a fourth embodiment of a micro-resonator according to the present invention.

FIG. 10 shows a fourth embodiment of a micro-resonator according to the present invention.

A micro-resonator 41 according to this embodiment includes a plurality of oscillation electrodes 27 disposed in parallel on the input electrode 24 and output electrode 25 of the micro-resonant element 33 shown in FIG. 9. Specifically, the plurality of oscillation electrodes 27 are disposed in parallel along a longitudinal direction of each of the input and output electrodes 24 and 25.

A micro-resonant element row 23'-1 is formed on the input electrode 24-1 and output electrode 25-1, a micro-resonant element row 23'-2 is formed on the input electrode 24-2 and output electrode 25-2, a micro-resonant element row 23'-3 is formed on the input electrode 24-3 and output electrode 25-3, and a micro-resonant element row 23'-4 is formed on the input electrode 24-4 and output electrode 25-4, respectively.

The same reference numerals are given to portions corresponding to those in the third embodiment, and a duplicated explanation thereof is omitted.

According to a micro-resonator 41 of this embodiment, one micro-resonator whose oscillation electrode area is enlarged can be obtained by adding the oscillation electrode 27 of each micro-resonant element 23. In addition, since either the input electrodes 24 or output electrodes 25 which are connected to the adjacent micro-resonant elements 23 are disposed to face each other, an oscillation phase of micro-resonant elements of each row, which is the micro-resonant element row 23'-1 for example, and an oscillation phase of an micro-resonant element row adjacent thereto, which is the micro-resonant element row 23'-2 for example, can be made reverse to have a mutually phase-reversed relation, even when a plurality of oscillation electrodes 27 are arranged in parallel on one pair of input electrode 24 and output electrode 25.

As a result, when a force generated in each of the micro-resonant element rows 23'-1 through 23'-4 by an oscillation of each oscillation electrode 27 acts mutually on the substrate 22, the forces act in opposite directions to cancel each other such that a sum of the forces generated on the substrate 22 becomes zero. Specifically, since there is no possibility that the substrate 22 oscillates by the force generated in the micro-resonant element due to the oscillation, an excellent transmission characteristic can be obtained, when the transmission characteristics of the adjacent micro-resonant element rows are overlapped.

Next, a method of manufacturing a micro-resonator according to this embodiment is explained by using FIGS. 11 and 12. Here, a cross-sectional structure of an relevant part of a micro-resonant element is shown in the drawings.

Figure 11A:
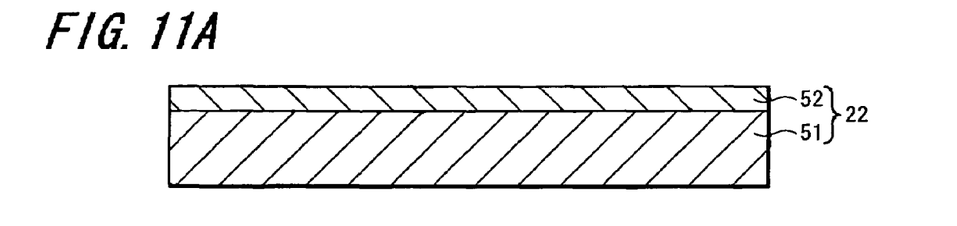
FIGS. 11A through 11E are (first) manufacturing process diagrams showing an embodiment of a method of manufacturing a micro-resonator according to the present invention.

In this embodiment, first as shown in FIG. 11A, the substrate 22 in which an insulation film 52 of a required film thickness is formed on an upper surface of a silicon substrate 51 is prepared. In this example, a silicon nitride (SiN) film 52 of a film thickness 1 μm is formed on the silicon substrate 51 to obtain the substrate 22.

Figure 11B:
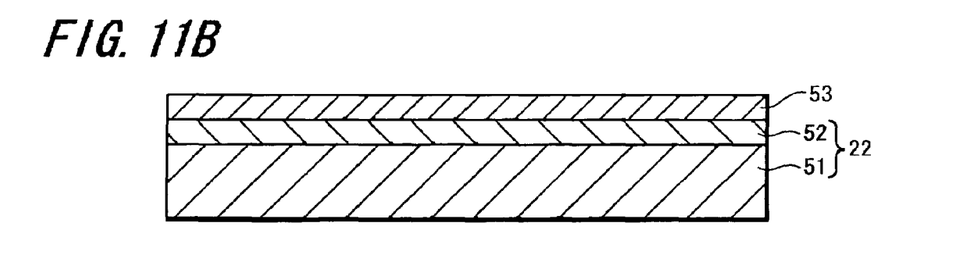

Next, as shown in FIG. 11B, a lower electrode that is a conductive film 53 of a required film thickness which becomes input and output electrodes is formed on the insulation film 52 of the substrate 22. In this example, on the silicon nitride film 52 is formed a polycrystalline silicon film (Poly-Si) 53 of a film thickness 0.5 μm by vapor deposition.

Figure 11C:
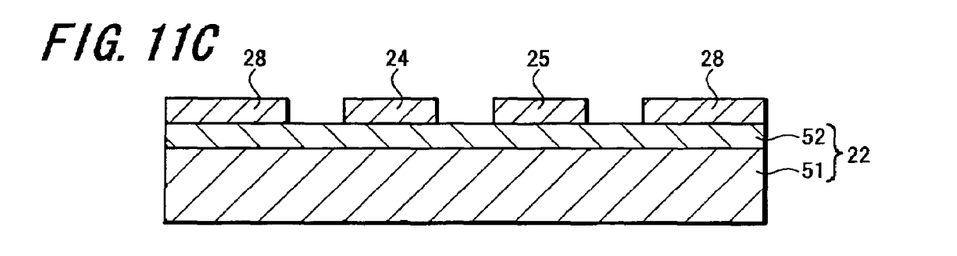

Subsequently, as shown in FIG. 11C, an input electrode 24 and an output electrode 25 which become lower electrodes, and a wiring layer 28 are formed by patterning the polycrystalline silicon film 53 by means of selective etching. The patterns of those input and output electrodes 24 and 25 and wiring layer 28 are formed into the patterns corresponding to the above-described FIGS. 5, 8, 9, and 10.

Figure 11D:
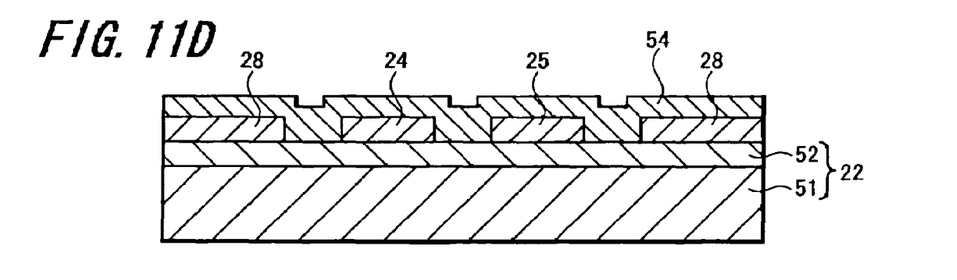

Next, as shown in FIG. 11D, a sacrifice layer 54 having a required film thickness is formed on the front surface of the substrate 22 including upper surfaces of the input and output electrodes 24 and 25 and the wiring layer 28. In this example, a silicon oxide (SiO$_2$) film 54 of a film thickness 0.5 μm to be the sacrifice layer is formed by the vapor deposition.

Figure 11E:
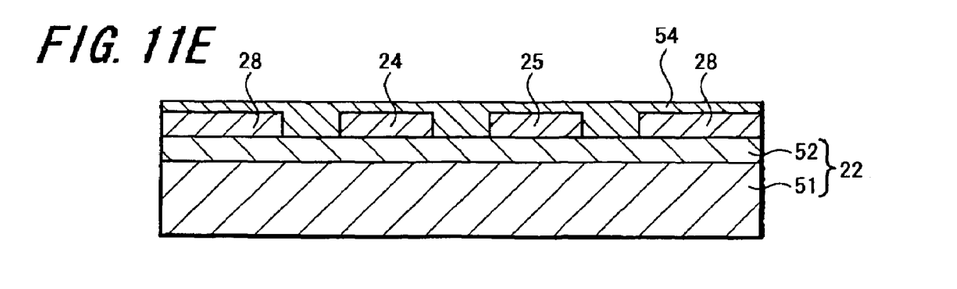

Next, as shown in FIG. 11E, the sacrifice layer 54 is planarized to set the film thickness of the sacrifice layer 54 on the input and output electrodes 24 and 25 into a required thickness. The film thickness of this sacrifice layer 54 is equivalent to the height of the space 26 between the above-described oscillation electrode 27 and the input and output electrodes 24 and 25. In this example, the silicon oxide film 54 of the sacrifice layer is planarized by using a CMP (Chemical Mechanical Polishing) method such that the silicon oxide film 54 of the film thickness 0.1 μm remains on the input and output electrodes 24 and 25.

Figure 12A:
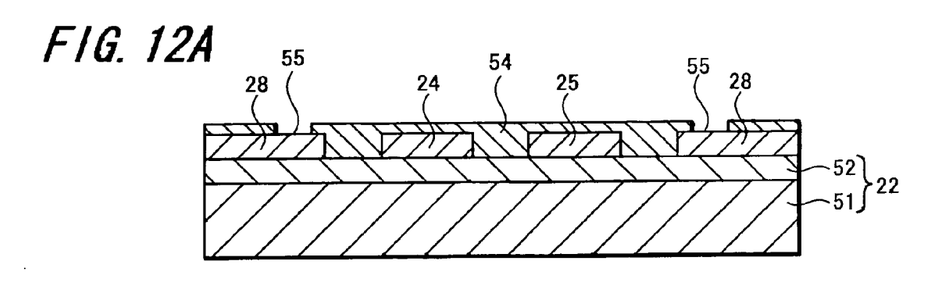
FIGS. 12A through 12D are (second) manufacturing process diagrams showing an embodiment of a method of manufacturing a micro-resonator according to the present invention.

Subsequently, as shown in FIG. 12A, selective etching is performed on part of sacrifice layer 54 to form a contact hole 55 to expose part of wiring layer 28.

Figure 12B:
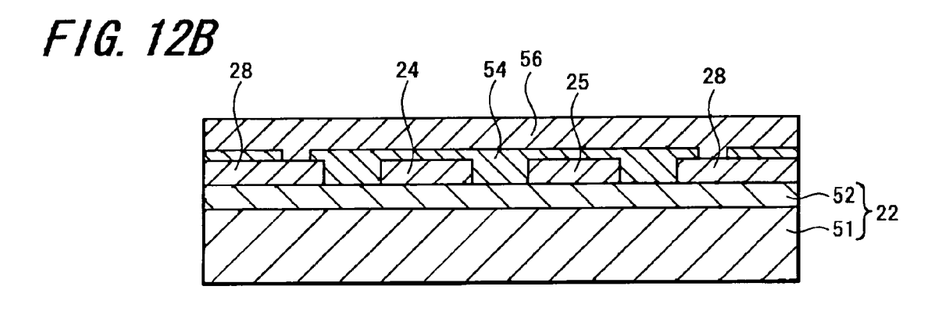

Next, as shown in FIG. 12B, a conductive film 56 of a required film thickness which becomes an oscillation electrode, that is, a beam is formed on the sacrifice layer 54. At this time, part of the conductive film 56 is connected to the wiring 28 through the contact hole 55. In this example, the polycrystalline silicon film 56 of a film thickness 0.5 μm that becomes the beam is formed by the vapor deposition.

It should be noted that the above-described polycrystalline silicon films 53 and 56 and silicon oxide film 54 can be formed by a CVD (Chemical Vapor Deposition) method but it is also possible to form by a physical vapor deposition method.

Figure 12C:
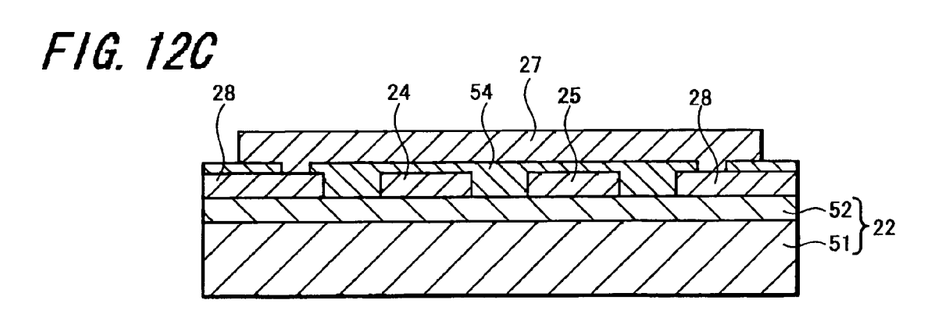

Next, as shown in FIG. 12C, the beam 27 that becomes an oscillation electrode is formed by patterning the polycrystalline silicon film 56 that is a conductive film.

Figure 12D:
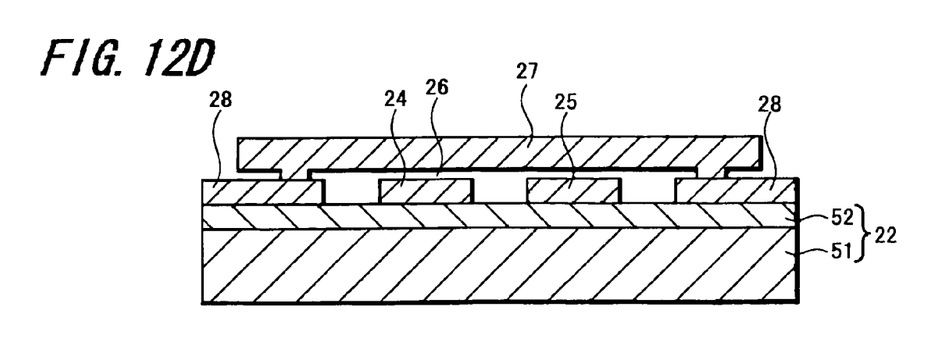

Next, as shown in FIG. 12D, the sacrifice layer 54 is selectively removed. In this example, the silicon oxide film 54 that is the sacrifice layer is removed by fluoric acid. Accordingly, the micro-resonator 21, 31, 33, or 41 in which the beam, that is, the oscillation electrode 27 is disposed to face the input electrode 24 and output electrode 25 separated by the required space 26 is obtained.

According to an embodiment of the present invention, a frequency filter can be obtained using each micro-resonator of the above-described embodiments. The filter based on the micro-resonator can be used as a high frequency (RF) filter, an intermediate frequency (IF) filter and the like.

According to an embodiment of the present invention, a communication apparatus in which communication is performed using an electromagnetic wave, such as a cellular phone, a wireless LAN device, a wireless transceiver, a television tuner, a radio tuner and so on which include the filter having the micro-resonator of the above-described embodiments, can be obtained.

Figure 13:
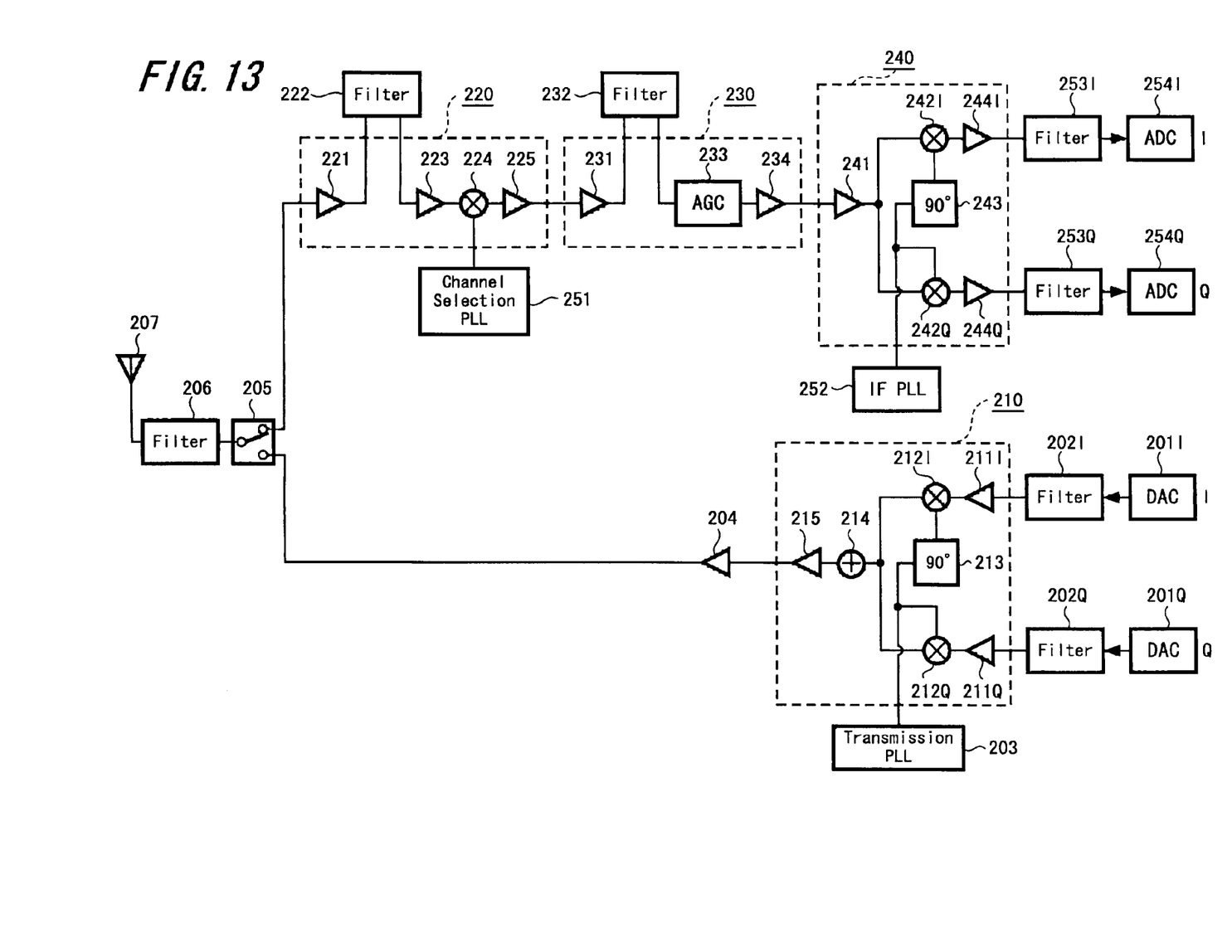
FIG. 13 is a circuit diagram showing an embodiment of a communication apparatus according to the present invention.

Next, an example of a configuration of a communication apparatus, to which the above-described filter according to an embodiment of the present invention is applied, is explained by referring to FIG. 13.

First, an explanation is made regarding a configuration of a transmission system, in which transmission data of I channel and transmission data of Q channel are respectively supplied to digital/analogue converters (DAC) 201I and 201Q to be converted into analogue signals. The converted signal of each channel is supplied to band-pass filters 202I and 202Q, and outputs of the band-pass filters 202I and 202Q are supplied to a modulator 210 after a signal component other than a transmission signal band is removed.

In the modulator 210, each channel signal is supplied to mixers 212I and 212Q through buffer amplifiers 211I and 211Q. This signal and a frequency signal corresponding to a frequency signal supplied from a transmission PLL (phase-locked loop) circuit 203 are mixed and modulated, and the mixed signal is added in an adder 214 to make a transmission signal of one system. In this case, with respect to the frequency signal supplied to the mixer 212I, a signal phase is shifted by 90° with a phase shifter 213 so that the signal of I channel and the signal of Q channel are orthogonally modulated.

An output of the adder 214 is supplied to a power amplifier 204 through a buffer amplifier 215, and is amplified to have a predetermined transmission power. The signal amplified in the power amplifier 204 is supplied to an antenna 207 through a transmission-reception switching unit 205 and high frequency filter 206, and is wirelessly transmitted from the antenna 207. The high frequency filter 206 is a band-pass filter that removes a signal component other than the frequency band to perform transmission and reception in this communication apparatus.

As a configuration of a reception system, a signal received by the antenna 207 is supplied to a high frequency portion 220 through the high frequency filter 206 and transmission-reception switching unit 205. In the high frequency portion 220, the received signal is amplified in a low noise amplifier (LNA) 221 and after that the signal is supplied to a band-pass filter 222 to remove a signal other than that in a reception frequency band, and the signal after the removal is supplied to a mixer 224 through a buffer amplifier 223. Further, a frequency signal supplied from a channel selection PLL circuit 251 is mixed to make a signal of a predetermined transmission channel into an intermediate frequency signal, and the intermediate frequency signal is supplied to an intermediate frequency circuit 230 through a buffer amplifier 225.

In the intermediate frequency circuit 230, the supplied intermediate frequency signal is supplied to a band-pass filter 232 through a buffer amplifier 231 to remove a signal component other than that in the band of the intermediate frequency signal. The signal after this removal is supplied to an automatic gain control (AGC) circuit 233 and is made into a signal of an almost constant gain. The intermediate frequency signal whose gain is adjusted in the automatic gain control circuit 233 is supplied to a demodulator 240 through a buffer amplifier 234.

In the demodulator 240, the obtained intermediate frequency signal is supplied to mixers 242I and 242Q through a buffer amplifier 241 to mix a frequency signal supplied from an intermediate frequency PLL circuit 252 so that the received signal component of I channel and signal component of Q channel are demodulated. In this case, a frequency signal whose signal phase is shifted by 90° in a phase shifter 243 is supplied to the I signal mixer 242I to demodulate the orthogonally modulated signal component of I channel and signal component of Q channel.

The demodulated signals of I channel and Q channel are supplied respectively to band-pass filters 253I and 253Q through buffer amplifiers 244I and 244Q to remove a signal component other than the signals of I channel and Q channel. The signals after the removal are supplied to analogue/digital converters (ADC) 254I and 254Q, and are sampled to be made into digital data, so that I channel reception data and Q channel reception data are obtained.

With respect to the configuration explained above, band-limiting can be performed by applying the filter of the above-described embodiments to part of or all of the band-pass filters 202I, 202Q, 206, 222, 232, 253I and 253Q.

According to this communication apparatus, since the above-described filter having the combined impedance suitable for a communication apparatus to be applied is included, a highly reliable communication apparatus can be provided. Further, according to the communication apparatus of the present invention, since the filter including the micro-resonator having the high transmission characteristic is included, a communication apparatus of high communication reliability can be obtained.

Although each filter is configured as a band-pass filter in the example of FIG. 13, the filter is configured as a low pass filter that passes only a frequency band lower than a predetermined frequency and as a high pass filter that passes only a frequency band higher than a predetermined frequency, to which the filter having the above-described configuration of each embodiment is applied. In addition, the example of FIG. 13 is the communication apparatus that performs wireless transmission and wireless reception, however, the filter according to an embodiment of the present invention can be applied to a filter included in a communication apparatus that performs transmission and reception through a wired transmission path, and furthermore can be applied to a filter included in a communication apparatus that performs only transmission processing and in a communication apparatus that performs only reception processing.

It should be understood by those skilled in the art that various modifications, combinations, sub-combinations and alterations may occur depending on design requirements and other factors insofar as they are within the scope of the appended claims or the equivalents thereof.

What is claimed is:

1. A micro-resonator comprising:
   a plurality of micro-resonant elements having a beam structure facing an input electrode and an output electrode which use a micromechanical oscillation provided on the same substrate,
   wherein,
   a micro-resonant element to oscillate in a first phase and a micro-resonant element to oscillate in a second phase that is a reverse phase to the first phase are disposed to be a pair.

2. A micro-resonator according to claim 1, wherein said plurality of micro-resonant elements are connected electrically in parallel.

3. A micro-resonator comprising:
   a plurality of micro-resonant elements connected electrically in parallel, including an input electrode and output electrode disposed on the same substrate and a beam that becomes an oscillation plate disposed to face said input electrode and output electrode separated by a space,
   wherein either said input electrodes or output electrodes are disposed to face each other.

4. A micro-resonator according to claim 3, wherein said micro-resonant element includes a plurality of beams made of oscillation plates disposed in parallel with said input electrode and output electrode in common.

5. A micro-resonator according to claim 3 or 4, further comprising:
   a support member to support said beam, which is provided on said substrate.

6. A frequency filter comprising:
   a micro-resonator including a plurality of micro-resonant elements having a beam structure facing an input electrode and an output electrode which use a micromechanical oscillation provided on the same substrate,
   wherein a micro-resonant element to oscillate in a first phase and a micro-resonant element to oscillate in a second phase that is a reverse phase to the first phase are disposed to be a pair.

7. A frequency filter according to claim 6, wherein said plurality of micro-resonant elements are connected electrically in parallel.

8. A frequency filter comprising:
   a micro-resonator including a plurality of micro-resonant elements connected electrically in parallel, which have an input electrode and output electrode disposed on the same substrate and a beam that becomes an oscillation plate disposed to face said input electrode and output electrode separated by a space,
   wherein either said input electrodes or output electrodes are disposed to face each other.

9. A frequency filter according to claim 8, wherein
said micro-resonator includes a plurality of beams made of oscillation plates disposed in parallel with said input electrode and output electrode in common.

10. A communication apparatus including a filter to limit a band of a transmission signal and/or reception signal, comprising as said filter:
a filter including a micro-resonator having a plurality of micro-resonant elements having a beam structure facing an input electrode and an output electrode which use a micromechanical oscillation provided on the same substrate, wherein a micro-resonant element to oscillate in a first phase and a micro-resonant element to oscillate in a second phase that is a reverse phase to the first phase are disposed to be a pair.

11. A communication apparatus according to claim 10, wherein
said plurality of micro-resonant elements in the micro-resonator included in said filter are connected electrically in parallel.

12. A communication apparatus including a filter to limit a band of a transmission signal and/or reception signal, comprising as said filter:
a filter including a micro-resonator having a plurality of micro-resonant elements connected electrically in parallel, provided with an input electrode and output electrode disposed on the same plane and a beam that becomes an oscillation plate disposed to face said input electrode and output electrode separated by a space,
wherein either said input electrodes or output electrodes are disposed to face each other.

13. A communication apparatus according to claim 12, wherein
the micro-resonator in said filter includes a plurality of beams made of oscillation plates disposed in parallel with said input electrode and output electrode in common.

* * * * *